United States Patent
Cai et al.

(10) Patent No.: US 9,576,514 B2
(45) Date of Patent: Feb. 21, 2017

(54) METHOD FOR DETECTING DISCONNECTION OF GATE LINE AND DETECTION APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhenfei Cai, Beijing (CN); Xu Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 70 days.

(21) Appl. No.: 14/422,907

(22) PCT Filed: Jul. 25, 2014

(86) PCT No.: PCT/CN2014/083078
§ 371 (c)(1),
(2) Date: Feb. 20, 2015

(87) PCT Pub. No.: WO2015/043306
PCT Pub. Date: Apr. 2, 2015

(65) Prior Publication Data
US 2016/0049104 A1    Feb. 18, 2016

(30) Foreign Application Priority Data
Sep. 29, 2013 (CN) .......................... 2013 1 0454960

(51) Int. Cl.
G09G 3/00 (2006.01)
G01R 31/02 (2006.01)
G02F 1/1362 (2006.01)

(52) U.S. Cl.
CPC .............. *G09G 3/006* (2013.01); *G01R 31/02* (2013.01); *G01R 31/025* (2013.01);
(Continued)

(58) Field of Classification Search
None
See application file for complete search history.

(56) References Cited

U.S. PATENT DOCUMENTS 7,626,414 B2 * 12/2009 Lee ....................... G02F 1/1345
324/760.01
2005/0258836 A1    11/2005 Lee et al.
(Continued)

FOREIGN PATENT DOCUMENTS

CN    102213739 A    10/2011
CN    102289119 A    12/2011
(Continued)

OTHER PUBLICATIONS

First Chinese Office Action dated Jun. 24, 2015; Appln. No. 201310454960.0
(Continued)

*Primary Examiner* — Patrick Assouad
*Assistant Examiner* — Douglas X Rodriguez
(74) *Attorney, Agent, or Firm* — Ladas & Parry LLP

(57) ABSTRACT

A detecting method and a detecting apparatus for detection of a gate line disconnection. The gate line disconnection detecting method includes step 1: providing a first unit (41) at least capable of receiving signals at one end of a gate line to be detected (2), and providing a second unit (42) at least capable of transmitting signals at the other end of it; step 2: providing a first signal receiving unit (51) for receiving signals on a gate line other than the gate line to be detected (2). With respect to the gate line disconnection detecting method, whether disconnection occurs or not is judged
(Continued)

depending on the signal strength received by the first signal receiving unit (51), and thus, the case that in a gate line disconnection detection of a bilateral drive type display device, whether a gate line is disconnected or not can be accurately detected, is realized. By it, technical supports are provided for getting rid of bad products timely, and a goal of promoting the yield of products is achieved.

17 Claims, 2 Drawing Sheets

(52) U.S. Cl.
CPC .. *G02F 1/136259* (2013.01); *G02F 1/136286* (2013.01); *G02F 2001/136254* (2013.01); *G02F 2001/136263* (2013.01); *G09G 2330/12* (2013.01)

(56) References Cited

U.S. PATENT DOCUMENTS

2007/0138417 A1    6/2007   Sugiyama et al.
2014/0375344 A1   12/2014   Wang

FOREIGN PATENT DOCUMENTS

| CN | 102723311 A | 10/2012 |
|---|---|---|
| CN | 103325327 A | 9/2013 |
| CN | 103499892 A | 1/2014 |
| CN | 103852922 A | 6/2014 |
| KR | 20050110324 A | 11/2005 |

OTHER PUBLICATIONS

Second Chinese Office Action dated Oct. 19, 2015; Appln. No. 201310454960.0.
Chinese Notice of Allowance dated Jan. 15, 2016; Appln. No. 201310454960.0.
First Chinese Office Action dated Jun. 24, 2015; Appln. No. 201310454960.0.
International Search Report dated Sep. 15, 2014; PCT/CN2014/083078.
Written Opinion of the International Searching Authority dated Sep. 22, 2014; PCT/CN2014/083078.

* cited by examiner

METHOD FOR DETECTING DISCONNECTION OF GATE LINE AND DETECTION APPARATUS

TECHNICAL FILED

Embodiments of the present invention relate to a method for detecting disconnection of a gate line and a detection apparatus.

BACKGROUND

As compared with traditional cathode ray tube display devices, flat panel display devices have the merits of being light and thin, low driving voltage, flicker-free, no dithering, long service life, and so on; and flat panel display devices are classified into active light-emitting display devices and passive light-emitting display devices. For example, Thin Film Transistor-Liquid Crystal Displays (TFT-LCDs) are a kind of passive light-emitting display devices. As they have the merits of stable picture, lifelike images, irradiation eliminating, space saving, energy consumption saving and so on, they have been widely applied to televisions, cell phones, display devices and other electronic products, and have played a leading role in the field of planar display.

A liquid crystal display device mainly includes a liquid crystal display panel and driving devices for driving the liquid crystal display panel; and the liquid crystal display panel mainly includes a first substrate and a second substrate that are disposed oppositely. In general, the first substrate and the second substrate are an array substrate and a color filter substrate, respectively, and the array substrate includes a plurality of data lines and a plurality of gate lines that are arranged in a crisscross pattern. Pixel units are defined by the data lines and the gate lines one after another. The driving devices include a gate driving circuit for outputting a scan signal to a gate line and a source driving circuit for outputting a data signal to a data line.

In order to reduce the total size and manufacturing cost of a liquid crystal display device, a GOA (Gate Driver on Array) technology and a bilateral drive display technology get more and more attention. The GOA technology refers to such a process technology that a gate driving circuit is produced on an array substrate directly to replace a driving chip made by an externally bonded silicon slice; with the application of GOA technology, it is possible that procedures of the production process are decreased, the process cost of products is reduced, and integration level of the liquid crystal display panel is enhanced. The bilateral drive display refers to the case where all of pixel units in two adjacent columns share one data line, so that the number of data lines is decreased; pixel units in the same row are connected to two gate lines adjacent to each other, respectively, and gate driving circuits for supplying two scan signals that differ from each other to two gate lines are provided on two sides of an array substrate.

In the producing process of an array substrate, it is necessary for it to undergo many detecting processes, and gate-line disconnection detection is one of them. As illustrated in FIG. 1, when a bilateral display device is subjected to gate-line disconnection detection, in view of the fact that a short-circuited structure is contained on each of two sides of an array substrate, that is, both ends of each gate line 2 are connected to a first detection line 11 and a second detection line 12 on two sides of the array substrate, respectively, so as to form the short-circuited structure, gate disconnection cannot be detected by a gate-line disconnection detecting method in prior art. As specifically illustrated in FIG. 1, the gate-line disconnection detecting method in prior art is that, corresponding ones of signal transmitting/receiving units are provided at two ends of a gate line to be detected, respectively, and each of the signal transmitting/receiving units not only can transmit test signals, but also can receive test signals. In the disconnection detecting process of a gate line to be detected, supposing that one signal transmitting/receiving unit transmits a test signal (e.g., a first signal transmitting/receiving unit 41 in the figure transmits a test signal), even though the gate line to be detected is broken off, owing to existence of the above short-circuited structure, the test signal will be transferred to a second signal transmitting/receiving unit 42 through a gate line adjacent to the gate line to be detected, leading to incapability of detecting disconnection of the gate line.

SUMMARY

According to an embodiment of the present invention, there is provided a method for detecting disconnection of a gate line.

A method for detecting disconnection of a gate line, two ends of which are connected to a first detection line and a second detection line, respectively, and the gate line being provided in multiple rows, the method comprising:

step 1: providing a first unit at least capable of receiving signals at one end of a gate line to be detected, and providing a second unit at least capable of transmitting signals at the other end of it;

step 2: providing a first signal receiving unit for receiving signals on a gate line other than the gate line to be detected.

In an example, the step 2 includes arranging the first signal receiving unit on a gate line neighboring the gate line to be detected.

In an example, the step 2 includes arranging first signal receiving units on a gate line in a row located on one side of the gate line to be detected and neighboring the gate line to be detected and on a gate line in a row located on the other side of the gate line to be detected and neighboring the gate line to be detected, respectively.

In an example, the first signal receiving unit is situated in the middle of the gate line where it is located.

In an example, at least one of the first unit and the second unit is a signal transmitting/receiving unit; or, the first unit is a second signal receiving unit, and the second unit is a signal transmitting unit.

In an example, after the step 2, the method further includes:

step 3: judging whether or not the signal strength received by the first signal receiving unit is equal to or larger than a preset value: if so, then it is judged that disconnection occurs to the gate line to be detected, wherein, the preset value is the minimum value of signal strength values that are received by the first signal unit and obtained by performing detection of a plurality of gate lines that are disconnected.

According to another embodiment of the invention, there is further provided a gate line disconnection detection apparatus for implementing any of the gate line disconnection detecting methods as stated above.

A gate line disconnection detecting apparatus, comprising a first unit at least capable of receiving signals, a second unit at least capable of transmitting signals and a first signal receiving unit;

the first unit is disposed at one end of a gate line to be detected, and the second unit is disposed at the other end of the gate line to be detected;

the first signal receiving unit is disposed on a gate line other than the gate line to be detected.

In an example, the number of the first signal receiving unit is one; and the first signal receiving unit is arranged on a gate line in a row neighboring the gate line to be detected.

In an example, the number of the first signal receiving unit is two; and the two first signal receiving units are arranged on gate lines in corresponding ones of rows located on each side of the gate line to be detected and neighboring the gate line to be detected, respectively.

In an example, the apparatus further includes a judging unit which is configured to judge whether or not the signal strength received by the first signal receiving unit is equal to or larger than a preset value: if so, then it is judged that disconnection occurs to the gate line to be detected, wherein, the preset value is the minimum value of signal strength values that are received by the first signal unit and obtained by performing detection of a plurality of gate lines that are disconnected.

According to still another embodiment of the invention, there is further provided another method for detecting gate line disconnection:

A gate line disconnection detecting method, the gate line being provided in multiple rows; comprising:

step 1: providing signal receiving units for receiving signals at two ends of a gate line to be detected, respectively;

step 2: providing a second unit at least capable of transmitting signals between the signal receiving units located at two ends of the gate line to be detected.

In an example, the second unit is arranged in the middle of the gate line to be detected.

In an example, step 3: judging whether or not signals are received by both of the signal receiving units: if not, then it is judged that disconnection occurs to the gate line to be detected.

In an example, the second unit is a signal transmitting unit for transmitting signals.

According to still another embodiment of the invention, there is further provided a gate line disconnection detection apparatus for implanting the another method for detecting gate line disconnection as stated above:

A gate line disconnection detecting apparatus, comprising a second unit at least capable of transmitting signals and two signal receiving units;

the two signal receiving units are disposed at two ends of a gate line to be detected, respectively;

the second unit is arranged between the signal receiving units at two ends of the gate line to be detected.

Preferably, the apparatus further includes a judging unit which is configured to judge whether or not signals are received by both of the signal receiving units: if not, then it is judged that disconnection occurs to the gate line to be detected.

With respect to the gate line disconnection detecting method provided by embodiments of the invention, by means of providing a first unit at least capable of receiving signals at one end of a gate line to be detected, providing a second unit at least capable of transmitting signals at the other end of it, and arranging a first signal receiving unit for receiving signals on a gate line other than the gate line to be detected, whether disconnection occurs or not is judged depending on the signal strength received by the first signal receiving unit. Alternatively, by means of providing signal receiving units for receiving signals at two ends of a gate line to be detected, respectively, and providing a second unit at least capable of transmitting signals between the signal receiving units located at two ends of the gate line to be detected, whether or not disconnection occurs is judged according to whether signals are received by both of the signal receiving units or not. Thus, the case that in a gate line disconnection detection of a bilateral drive type display device, whether a gate line is disconnected or not can be accurately detected, is realized, thereby providing technical supports for getting rid of bad products timely, and achieving a goal of promoting the yield of products.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

Figure 1:
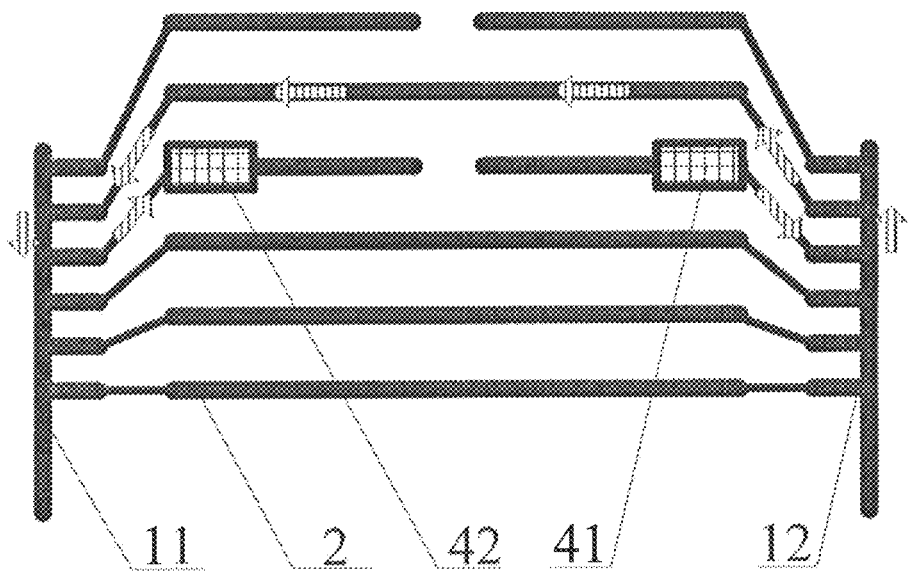
FIG. 1 is a schematic view illustrating a gate-line disconnection detecting method in prior art.

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

The main improvement of the invention lies in that, by means of arranging one unit at least capable of transmitting signals and at least two units capable of receiving signals, and by utilizing the mutual coordination between two units capable of receiving signals, the gate-line disconnection detection in a bilateral drive type display device is realized. Based on the basic concept, two implementing schemes are provided by the present invention.

Scheme 1

In a gate-line disconnection detecting method provided by the scheme, two ends of a gate line are connected to a first detection line and a second detection line, respectively, as for the gate line, there are multiple rows; the detecting method includes:

Step 1: a first unit at least capable of receiving signals is provided at one end of a gate line to be detected, and a second unit at least capable of transmitting signals is provided at the other end of it;

Step 2: a first signal receiving unit for reception of signals is provided on a gate line other than the gate line to be detected.

In correspondence with the above gate-line disconnection detecting method, a gate-line disconnection detection apparatus provided by the scheme includes a first unit at least capable of receiving signals, a second unit at least capable of transmitting signals and a first signal receiving unit. The first unit is provided at one end of a gate line to be detected, the second unit is provided at the other end of it, and the first signal receiving unit is provided on a gate line other than the gate line to be detected.

Scheme 2

In a gate-line disconnection detecting method provided by the scheme, two ends of a gate line are connected to a first detection line and a second detection line, respectively, as for the gate line, there are multiple rows; the detecting method includes:

Step 1: signal receiving units for reception of signals is arranged at each of both ends of a gate line to be detected;

Step 2: a second unit at least capable of transmitting signals is provided between the signal receiving units located at both ends of the gate line to be detected.

In correspondence with the above gate-line disconnection detecting method, a gate-line disconnection detection apparatus provided by the scheme includes a second unit at least capable of transmitting signals and two signal receiving units. Two signal receiving units as stated are arranged at two ends of a gate line to be detected, respectively; and the second unit is provided between the signal receiving units at both ends of the gate line to be detected.

Hereinafter, the gate-line disconnection detecting method and the detecting apparatus provided by the invention will be described in detail in conjunction with FIG. 2 to FIG. 4.

Embodiment 1

In the embodiment, there is firstly provided a gate-line disconnection detecting method. As illustrated in FIG. 2, gate lines 2 in multiple rows are arranged on an array substrate, and two ends of each gate line 2 are connected to a first detection line 11 and a second detection line 12 located on two sides of the array substrate, respectively, so as to form a short-circuited structure. The gate-line disconnection detecting method in the embodiment mainly includes the following steps.

Step 1: a first unit at least capable of receiving signals is provided at one end of a gate line to be detected, and a second unit at least capable of transmitting signals is provided at the other end of it. For example, at least one of the first unit and the second unit is a signal transmitting/receiving unit, namely, it is possible that a first signal transmitting/receiving unit is arranged at one end of a gate line to be detected, and a second signal receiving unit or signal transmitting unit is arranged at the other end of the gate line to be detected; alternatively, a first signal transmitting/receiving unit is arranged at one end of a gate line to be detected, and a second signal transmitting/receiving unit is arranged at the other end of the gate line to be detected. And for another example, the first unit is a second signal receiving unit, and the second unit is a signal transmitting unit, that is, the second signal receiving unit is arranged at one end of a gate line to be detected, and the signal transmitting unit or the like is arranged at the other end of the gate line to be detected. In the embodiment, descriptions will be given with reference to an example in which the first unit is a first signal transmitting/receiving unit 41 and the second unit is a second signal transmitting/receiving unit 42.

Step 2: first signal receiving units 51 are provided on a gate line in a row located on one side of a gate line to be detected and neighboring the gate line to be detected and a gate line in a row located on the other side of the gate line to be detected and neighboring the gate line to be detected, respectively. The first signal receiving units 51 being chosen to be provided on "adjacent" gate lines here is not the only selective mode for technical schemes of the invention, the goal still can be achieved with a choice of provision on non-adjacent gate lines. Only because the received signal strength in the case that a first signal receiving unit 51 is provided on a gate line neighboring the gate line to be detected may be stronger than that in the case that it is provided on other gate line, and judgment is made easily, the former case is described as a preferred embodiment. In addition, comparatively speaking, on the same gate line, arranging a first signal receiving unit 51 in the middle is not the only position selection for technical schemes of the invention, either, and the goal can still be achieved with a choice of being at such a location that is not in the middle. Only because delay losses of signals received from two ends of a gate line are the same in the case of being arranged in the middle, and accurate comparison is made conveniently, this case is described as a preferred embodiment. Thus, first signal receiving units 51 are further arranged in the middle of gate lines on which they are located in the embodiment. That is, one of the first signal receiving units 51 is arranged in the middle of a gate line in a row located on one side of a gate line to be detected and neighboring the gate line to be detected, and one of first signal receiving units 51 is arranged in the middle of a gate line in a row located on the other side of the gate line to be detected and neighboring the gate line to be detected.

In the embodiment, after the step 2, it further includes:

Step 3: it is judged whether or not the signal strength received by the first signal receiving units 51 is equal to or larger than a preset value.

If so, it is judged that disconnection occurs to the gate line to be detected.

Figure 2:
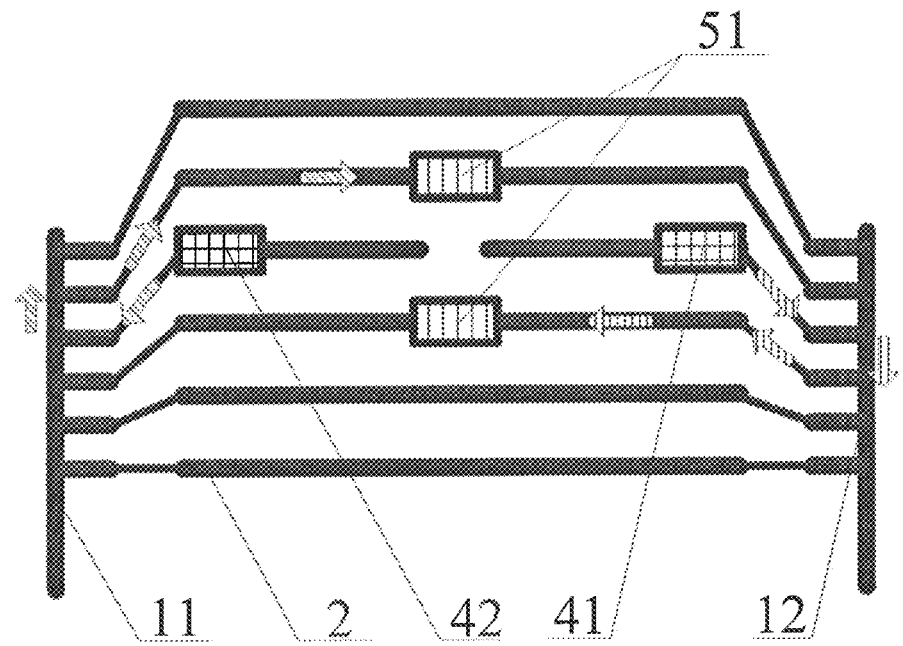
FIG. 2 is a schematic view illustrating a gate-line disconnection detecting method in Embodiment 1 of the invention.

For example, as illustrated in FIG. 2, test signals transmitted by the first signal transmitting/receiving unit 41 and the second signal transmitting/receiving unit 42 are transferred to two first signal receiving units 51 located on two sides of a gate line to be detected through gate lines neighboring the gate line to be detected. If no disconnection exists in the gate line to be detected, then a majority of test signals transmitted by the first signal transmitting/receiving unit 41 will be received by the second signal transmitting/receiving unit 42, a majority of test signals transmitted by the second signal transmitting/receiving unit 42 will be received by the first signal transmitting/receiving unit 41, while the signal strength received by the two first signal receiving units 51 is very low. Thus, it is possible that by means of setting up a preset value (for example, the preset value may be the minimum value of the signal strength values that are received by the first signal unit 51 and obtained by performing detection of a plurality of gate lines that are disconnected, e.g. 2V to 4V), whether disconnection occurs to the gate line or not can be judged by judging whether or not the test signal strength received by the first signal receiving unit 51 is equal to or larger than the preset value. In the event that one of the first unit and the second unit is a signal transmitting/receiving unit, and the other one is a second signal receiving unit or signal transmitting unit, or in the event that the first unit is a second signal receiving unit, and the second unit is a signal transmitting unit, the detection principle is similar to the above detection principle, and details are omitted here.

In the embodiment, there is further provided a gate-line disconnection detecting apparatus for implementing the above gate-line disconnection detecting method. As illustrated in FIG. 2, the gate-line disconnection detecting apparatus includes two signal transmitting/receiving units and two first signal receiving units 51. The two signal transmitting/receiving units are disposed at two ends of a gate line to be detected, respectively; and the two first signal receiving units 51 are disposed on gate lines in two rows located on two sides of the gate line to be detected and neighboring the gate line to be detected, respectively (as described in the above gate-line disconnection detecting method, they may also be provided on other gate lines). The gate-line disconnection detecting apparatus in the embodiment may result from improvement of an existing gate-line disconnection detecting apparatus, namely, it can be implemented by adding two first signal receiving units. Certainly, the gate-line disconnection detecting apparatus in the embodiment may have other implementing modes as well, and for example, the gate-line disconnection detecting apparatus includes one signal transmitting/receiving unit, one signal transmitting unit or second signal receiving unit, and two first signal receiving units. The signal transmitting/receiving unit is disposed at one end of a gate line to be detected, the one signal transmitting unit or second signal receiving unit is disposed at the other end of the gate line to be detected, and the two first signal receiving units are disposed on gate lines in two rows located on two sides of the gate line to be detected and neighboring the gate line to be detected, respectively. And for another example, the gate-line disconnection detecting apparatus includes one second signal receiving unit, one signal transmitting unit and two first signal receiving units. The second signal receiving unit is disposed at one end of a gate line to be detected, the signal transmitting unit is disposed at the other end of the gate line to be detected, and the two first signal receiving units are disposed on gate lines in two rows located on two sides of the gate line to be detected and neighboring the gate line to be detected, respectively.

Further, the gate-line disconnection detecting apparatus in the embodiment further includes a judging unit, in which, a preset value of signal strength received by the first signal receiving unit 51 is pre-stored. The preset value may be the minimum value of signal strength values that are received by the first signal unit and obtained by performing detection of a plurality of gate lines that are disconnected. If it is judged by the judging unit that the signal strength received by the first signal receiving unit 51 is smaller than the preset value, then it is judged that the gate line to be detected is not disconnected; if it is judged by the judging unit that the signal strength received by the first signal receiving unit 51 is equal to or larger than the preset value, then it is judged that disconnection occurs to the gate line to be detected.

Embodiment 2

In the embodiment, there is firstly provided a gate-line disconnection detecting method. As illustrated in FIG. 3, gate lines 2 in multiple rows are arranged on an array substrate, and two ends of each gate line 2 are connected to a first detection line 11 and a second detection line 12 located on two sides of the array substrate, respectively, so as to form a short-circuited structure. The gate-line disconnection detecting method in the embodiment mainly includes the following steps.

Step 1: a first unit at least capable of receiving signals is provided at one end of a gate line to be detected, and a second unit at least capable of transmitting signals is provided at the other end of it. For example, at least one of the first unit and the second unit is a signal transmitting/receiving unit, namely, it is possible that a first signal transmitting/receiving unit is arranged at one end of a gate line to be detected, and a second signal receiving unit or signal transmitting unit is arranged at the other end of the gate line to be detected; alternatively, a first signal transmitting/receiving unit is arranged at one end of a gate line to be detected, and a second signal transmitting/receiving unit is arranged at the other end of the gate line to be detected. And for another example, the first unit is a second signal receiving unit 52, and the second unit is a signal transmitting unit 61, that is, the second signal receiving unit 52 is arranged at one end of a gate line to be detected, and the signal transmitting unit 61 is arranged at the other end of the gate line to be detected. In the embodiment, descriptions will be given with reference to an example in which the first unit is a first signal receiving unit 52 and the second unit is a signal transmitting unit 61.

Step 2: a first signal receiving unit 51 is provided on a gate line in a row located on one side of a gate line to be detected and neighboring the gate line to be detected. In the case that the first signal receiving unit 51 is provided on a gate line neighboring the gate line to be detected, the received signal strength is stronger than that in the case that it is provided on other gate line, and thus judgment is made easily. In addition, it is also preferred to arrange the first signal receiving unit 51 in the middle of the gate line on which it is located in the embodiment. That is, one first signal receiving unit 51 is arranged in the middle of a gate line in a row located on one side of a gate line to be detected and neighboring the gate line to be detected.

In the step, the first signal receiving unit 51 being chosen to be provided on an "adjacent" gate line is not the only selective mode for technical schemes of the invention, the goal still can be achieved with a choice of provision on a non-adjacent gate line. Only because the received signal strength in the case that the first signal receiving unit 51 is provided on a gate line neighboring the gate line to be detected may be stronger than that in the case that it is provided on other gate line, and judgment is made easily, the former case is described as a preferred embodiment. In addition, comparatively speaking, on the same gate line, arranging a first signal receiving unit 51 in the middle is not the only position selection for technical schemes of the invention, either, and the goal can still be achieved with a choice of being at such a location that is not in the middle. Only because delay losses of signals received from two ends of a gate line are the same in the case of being arranged in the middle, and accurate comparison is made conveniently, this case is described as a preferred embodiment.

In the embodiment, after the step 2, it further includes:

Step 3: it is judged whether or not the signal strength received by the first signal receiving unit 51 is equal to or larger than a preset value.

If so, then it is judged that disconnection occurs to the gate line to be detected.

Figure 3:
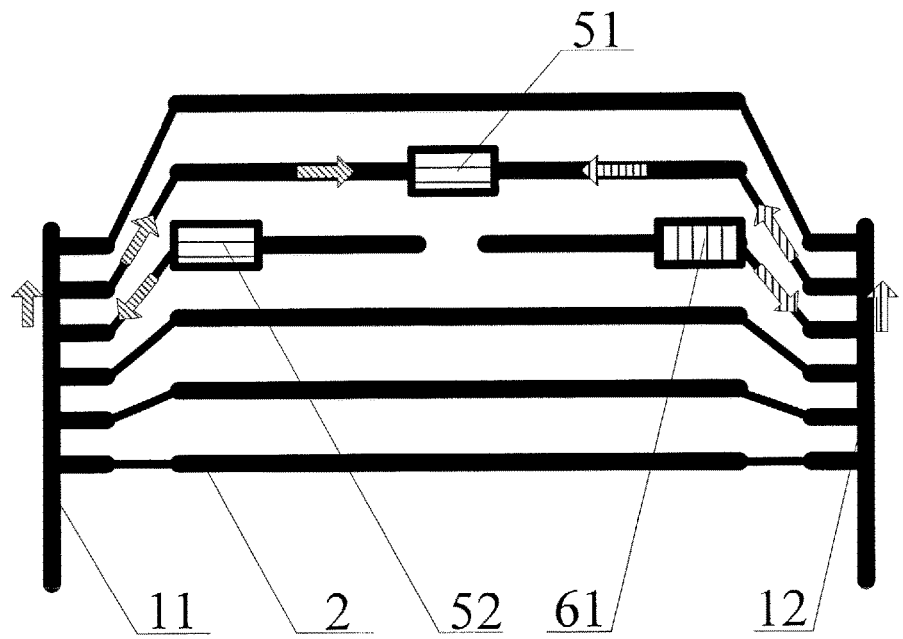
FIG. 3 is a schematic view illustrating a gate-line disconnection detecting method in Embodiment 2 of the invention.

For example, as illustrated in FIG. 3, test signals transmitted by the first signal transmitting unit 61 are transferred to one first signal receiving unit 51 located on one side of a gate line to be detected through a gate line neighboring the gate line to be detected. If no disconnection exists in the gate line to be detected, then a majority of test signals transmitted by the signal transmitting unit 61 will be received by the second signal receiving unit 52, while the signal strength received by the first signal receiving unit 51 is very low. Thus, it is possible that by means of setting up a preset value (for example, the preset value may be such a signal strength value that is received by the first signal receiving unit 51 in most signal detecting processes), whether disconnection occurs to the gate line or not can be judged by judging whether or not the test signal strength received by the first signal receiving unit 51 is equal to or larger than the preset value. In the event that one of the first unit and the second unit is a signal transmitting/receiving unit, and the other one is a second signal receiving unit, a signal transmitting unit or a signal transmitting/receiving unit, the detection principle is similar to the above detection principle, and details are omitted here.

In the embodiment, there is further provided a gate-line disconnection detecting apparatus for implementing the above gate-line disconnection detecting method. As illustrated in FIG. 3, the gate-line disconnection detecting apparatus includes one second signal receiving unit 52, one signal transmitting unit 61 and one first signal receiving unit 51. The second signal receiving unit 52 is disposed at one end of a gate line to be detected, the signal transmitting unit 61 is disposed at the other end of the gate line to be detected, and the one first signal receiving unit 51 is disposed on a gate line in a row located on one side of the gate line to be detected and neighboring the gate line to be detected (as described in the above gate-line disconnection detecting method, it may also be provided on other gate line). Certainly, the gate-line disconnection detecting apparatus in the embodiment may have other implementing modes as well, and for example, the gate-line disconnection detecting apparatus includes one signal transmitting/receiving unit, one signal transmitting unit 61 or a second signal receiving unit 52 or a signal transmitting/receiving unit, and one first signal receiving unit 51. The one signal transmitting/receiving unit is disposed at one end of a gate line to be detected, the one signal transmitting unit 61 or the second signal receiving unit 52 or the signal transmitting/receiving unit is disposed at the other end of the gate line to be detected, and the one first signal receiving unit 51 is disposed on a gate line in a row located on one side of the gate line to be detected and neighboring the gate line to be detected.

Further, the gate-line disconnection detecting apparatus in the embodiment further includes a judging unit, in which, a preset value of signal strength received by the first signal receiving unit 51 is pre-stored. The preset value may be the minimum value of signal strength values that are received by the first signal unit 51 and obtained by performing detection of a plurality of gate lines that are disconnected. If it is judged by the judging unit that the signal strength received by the first signal receiving unit 51 is smaller than the preset value, then it is judged that the gate line to be detected is not disconnected; if it is judged by the judging unit that the signal strength received by the first signal receiving unit 51 is equal to or larger than the preset value, then it is judged that disconnection occurs to the gate line to be detected.

As compared with the gate-line disconnection detecting method and detecting apparatus provided by Embodiment 1, one less first signal receiving unit is used in the gate-line disconnection detecting method and detecting apparatus provided by the embodiment, and thus they are implemented more conveniently.

Embodiment 3

In the embodiment, there is firstly provided a gate-line disconnection detecting method. As illustrated in FIG. 4, gate lines 2 in multiple rows are arranged on an array substrate, and two ends of each gate line 2 are connected to a first detection line 11 and a second detection line 12 located on two sides of the array substrate, respectively, so as to form a short-circuited structure. The gate-line disconnection detecting method in the embodiment mainly includes the following steps.

Step 1: Signal receiving units for receiving signals are arranged at both ends of a gate line to be detected, respectively. That is, a third signal receiving unit 53 is arranged at one end of the gate line to be detected, and a fourth signal receiving unit 54 is arranged at the other end of the gate line to be detected.

Step 2: a second unit at least capable of transmitting signals is provided between the signal receiving units located on both ends of the gate line to be detected. For example, the second unit is a signal transmitting unit 61 for transmitting signals, and may also be a signal transmitting/receiving unit or the like. On the same gate line, the signal transmitting unit 61 is arranged in the middle, and this enables the signal strength received by the signal receiving units disposed at both ends of the gate line to be detected to be more similar. Therefore, the signal transmitting unit 61 is further arranged in the middle of the gate line on which it is located in the embodiment.

In the embodiment, after the step 2, it further includes:

Step 3: it is judged whether or not signals are received by both of the signal receiving units.

If not, then it is judged that disconnection occurs to the gate line to be detected.

Figure 4:
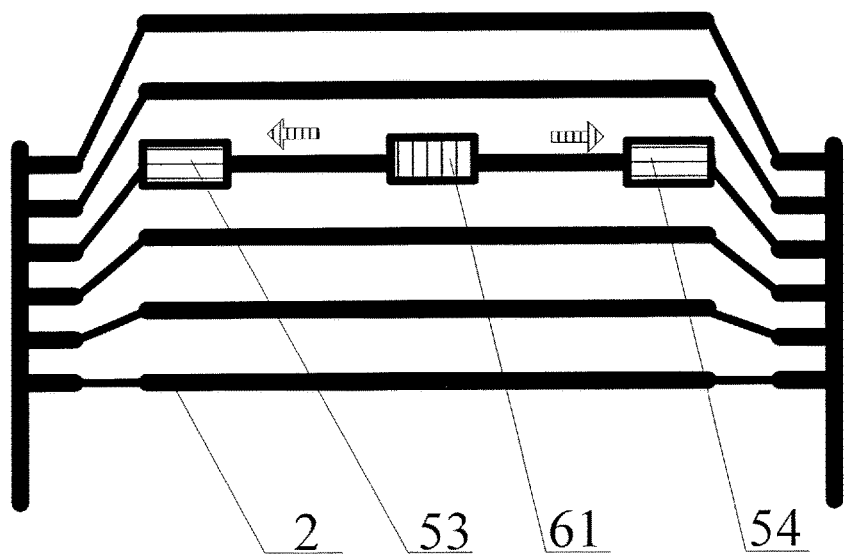
FIG. 4 is a schematic view illustrating a gate-line disconnection detecting method in Embodiment 3 of the invention.

For example, as illustrated in FIG. 4, test signals transmitted by the signal transmitting unit 61 are transferred to the third signal receiving unit 53 and the fourth signal receiving unit 54 located on two sides of a gate line to be detected, respectively. If no disconnection exists in the gate line to be detected, then signals are received by each of the third signal receiving unit 53 and the fourth signal receiving unit 54. And because the signal transmitting unit 61 is arranged in the middle of the gate line to be detected, the signal strength values received by the third signal receiving unit 53 and the fourth signal receiving unit 54 are roughly equal. Thus, when there is a signal receiving unit that did not receive a signal or the signal strength received by one signal receiving unit is too small, it can be judged that disconnection occurs to the gate line to be detected.

In the embodiment, descriptions have been made with reference to an example in which two ends of each gate line 2 are connected to a first detection line 11 and a second detection line 12 located on both sides of an array substrate, respectively. However, as the first signal receiving unit 53, the fourth signal receiving unit 54 and the signal transmitting unit 61 in the embodiment are all disposed on the same gate line, detection can be accomplished without needing a first detection line and a second detection line.

In the embodiment, there is further provided a gate-line disconnection detecting apparatus for implementing the above gate-line disconnection detecting method. As illustrated in FIG. 4, the gate-line disconnection detecting apparatus includes two signal receiving units and one signal transmitting unit 61. A third signal receiving unit 53 is disposed at one end of a gate line to be detected, a fourth signal receiving unit 54 is disposed at the other end of the gate line to be detected. The signal transmitting unit 61 is arranged in the middle of the gate line to be detected; certainly, as described in the above gate-line disconnection detecting method, it may also be disposed at other location of the gate line to be detected.

Further, the gate-line disconnection detecting apparatus in the embodiment further includes a judging unit, for judging whether or not signals are received by both of the signal receiving units: if not, then it is judged that disconnection occurs to the gate line to be detected.

As compared with the gate-line disconnection detecting methods and detecting apparatuses provided by Embodiment 1 and Embodiment 2, detection of gate line disconnection can be realized without setting up a preset value by the gate-line disconnection detecting method and detecting apparatus provided by the embodiment, and the detecting method is simpler, and thus is implemented conveniently and more practical.

Descriptions made above are merely exemplary embodiments of the invention, but are not used to limit the protection scope of the invention. The protection scope of the invention is determined by attached claims.

This application claims the benefit of priority from Chinese patent application No. 201310454960.0, filed on Sep. 29, 2013, the disclosure of which is incorporated herein in its entirety by reference as a part of the present application.

The invention claimed is:

1. A method for detecting disconnection of a plurality of gate lines; two ends of each of the gate lines are connected to a first detection line and a second detection line, respectively, so as to form a short-circuited structure, and the gate lines being provided in multiple rows; the method comprising:

step 1: providing a first unit at one end of a gate line to be detected, the first unit being at least capable of receiving signals from the gate line to be detected; and providing a second unit at the other end of the gate line to be detected, the second unit being at least capable of transmitting signals to the gate line to be detected;

step 2: providing a first signal receiving unit on a gate line other than the gate line to be detected, the first signal receiving unit being capable of receiving signals from the second unit;

after the step 2, the method further includes:

step 3: judging whether or not the signal strength received by the first signal receiving unit is larger than a preset value; if so, then it is judged that disconnection occurs to the gate line to be detected.

2. The method for detecting disconnection of the gate line according to claim 1, wherein, the step 2 includes arranging the first signal receiving unit on a gate line neighboring the gate line to be detected.

3. The method for detecting disconnection of the gate line according to claim 2, wherein, the step 2 includes arranging first signal receiving units on a gate line in a row located on one side of the gate line to be detected and neighboring the gate line to be detected and on a gate line in a row located on the other side of the gate line to be detected and neighboring the gate line to be detected, respectively.

4. The method for detecting disconnection of the gate line according to claim 2, wherein, at least one of the first unit and the second unit is a signal transmitting/receiving unit; or, the first unit is a second signal receiving unit, and the second unit is a signal transmitting unit.

5. The method for detecting disconnection of the gate line according to claim 2, wherein, the preset value in the step 3 is a signal strength value that is received by the first signal receiving unit in most signal detecting processes.

6. The method for detecting disconnection of the gate line according to claim 2, wherein, the step 2 further includes arranging the first signal receiving unit on a gate line in one row neighboring the gate line to be detected.

7. The method for detecting disconnection of the gate line according to claim 1, wherein, the first signal receiving unit is situated in the middle of the gate line where it is located.

8. The method for detecting disconnection of the gate line according to claim 1, wherein, at least one of the first unit and the second unit is a signal transmitting/receiving unit; or, the first unit is a second signal receiving unit, and the second unit is a signal transmitting unit.

9. The method for detecting disconnection of the gate line according to claim 1, wherein, the preset value in the step 3 is a signal strength value that is received by the first signal receiving unit in most signal detecting processes.

10. A gate line disconnection detection apparatus for implementing the method according to claim 1, comprising the first unit, the second unit and the first signal receiving unit;

wherein, the first unit is disposed at one end of a gate line to be detected, and the second unit is disposed at the other end of the gate line to be detected;

the first signal receiving unit is disposed on a gate line other than the gate line to be detected;

further comprising a judging unit which is configured to judge whether or not the signal strength received by the first signal receiving unit is larger than a preset value: if so, then it is judged that disconnection occurs to the gate line to be detected.

11. The gate line disconnection detection apparatus according to claim 10, wherein, the number of the first signal receiving unit is one; and the first signal receiving unit is arranged on a gate line in a row neighboring the gate line to be detected.

12. The gate line disconnection detection apparatus according to claim 10, wherein, the number of the first signal receiving unit is two; and the two first signal receiving units are arranged on gate lines in corresponding ones of rows located on each side of the gate line to be detected and neighboring the gate line to be detected, respectively.

13. A method for detecting disconnection of a plurality of gate lines two ends of each of the gate lines are connected to a first detection line and a second detection line, respectively, so as to form a short-circuited structure, and the gate lines being provided in multiple rows, wherein, the method comprises:

step 1: providing two signal receiving units at two ends of a gate line to be detected, respectively;

step 2: providing a second unit between the signal receiving units located at two ends of the gate line to be detected, wherein the second unit is at least capable of transmitting signals to the gate line to be detected, the two signal receiving units are capable of receiving signals from the second unit;

after the step 2, the method further includes:

step 3: judging whether or not signals are received by both of the signal receiving units:

if not, then it is judged that disconnection occurs to the gate line to be detected.

14. The method for detecting disconnection of the gate line according to claim 13, wherein, the second unit is arranged in the middle of the gate line to be detected.

15. The method for detecting disconnection of the gate line according to claim 14, wherein, the second unit is a signal transmitting unit for transmitting signals.

16. The method for detecting disconnection of the gate line according to claim 13, wherein, the second unit is a signal transmitting unit for transmitting signals.

17. A gate line disconnection detection apparatus for implanting the method according to claim 13, comprising the second unit and the two signal receiving units;

the two signal receiving units are disposed at two ends of a gate line to be detected, respectively;

the second unit is arranged between the signal receiving units at two ends of the gate line to be detected;

a judging unit which is configured to judge whether or not signals are received by both of the signal receiving units: if not, then it is judged that disconnection occurs to the gate line to be detected.

* * * * *